(12) United States Patent
Zhao et al.

(10) Patent No.: US 9,646,840 B2
(45) Date of Patent: May 9, 2017

(54) METHOD FOR CMP OF HIGH-K METAL GATE STRUCTURES

(71) Applicant: Semiconductor Manufacturing International (Shanghai) Corporation, Shanghai (CN)

(72) Inventors: Jian Zhao, Shanghai (CN); Hangping Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/686,618

(22) Filed: Apr. 14, 2015

(65) Prior Publication Data

US 2015/0340451 A1    Nov. 26, 2015

(30) Foreign Application Priority Data

May 26, 2014 (CN) .......................... 2014 1 0226180

(51) Int. Cl.

| H01L 21/306 | (2006.01) |
|---|---|
| H01L 21/28 | (2006.01) |
| H01L 21/8234 | (2006.01) |
| H01L 29/66 | (2006.01) |
| H01L 21/321 | (2006.01) |

(52) U.S. Cl.
CPC .. *H01L 21/30625* (2013.01); *H01L 21/28035* (2013.01); *H01L 21/28123* (2013.01); *H01L 21/82345* (2013.01); *H01L 21/823456* (2013.01); *H01L 29/66545* (2013.01); *H01L 21/28079* (2013.01); *H01L 21/3212* (2013.01)

(58) Field of Classification Search
CPC ....... H01L 21/31051; H01L 21/823828; H01L 23/585; H01L 29/408; H01L 21/28035; H01L 21/30625; H01L 29/4916
See application file for complete search history.

(56) References Cited

U.S. PATENT DOCUMENTS

| 5,624,863 | A | * | 4/1997 | Helm | .............. | H01L 21/823871 |
|---|---|---|---|---|---|---|
| | | | | | | 257/E21.641 |
| 6,235,597 | B1 | * | 5/2001 | Miles | .................. | H01L 29/6653 |
| | | | | | | 257/E21.346 |
| 6,630,710 | B1 | * | 10/2003 | Augusto | ........... | H01L 29/66651 |
| | | | | | | 257/327 |
| 7,952,147 | B2 | * | 5/2011 | Ueno | .............. | H01L 21/823807 |
| | | | | | | 257/206 |
| 9,093,550 | B1 | * | 7/2015 | Zhao | ...................... | H01L 21/82 |
| 2005/0142774 | A1 | * | 6/2005 | Lee | .................. | H01L 29/66545 |
| | | | | | | 438/296 |

(Continued)

*Primary Examiner* — Mohsen Ahmadi
(74) *Attorney, Agent, or Firm* — Kilpatrick Townsend & Stockton LLP

(57) ABSTRACT

A method for manufacturing a semiconductor device includes providing a substrate containing a front-end device and forming a dielectric layer on the substrate. The front-end device includes a first dummy gate in a first type metal gate transistor region, a second dummy gate in a second type metal gate transistor region, and a polysilicon gate in a polysilicon gate region. The method also includes removing a thickness of the first, second, and polysilicon gates and forming a protective layer on the polysilicon layer to protect the polysilicon layer during a CMP process, thereby improving the performance and yield of the semiconductor device.

14 Claims, 5 Drawing Sheets

(56) References Cited

U.S. PATENT DOCUMENTS

| | | | |
|---|---|---|---|
| 2006/0019587 A1* | 1/2006 | Deopura | B24B 37/26 451/526 |
| 2010/0112811 A1* | 5/2010 | Yeh | H01L 21/823828 438/669 |
| 2010/0124818 A1* | 5/2010 | Lee | H01L 21/823807 438/589 |
| 2010/0237435 A1* | 9/2010 | Chudzik | H01L 21/823437 257/380 |
| 2011/0081774 A1* | 4/2011 | Yeh | H01L 21/823835 438/591 |
| 2012/0021594 A1* | 1/2012 | Gurtej | H01L 21/823456 438/585 |
| 2012/0132998 A1* | 5/2012 | Kwon | H01L 21/28088 257/369 |
| 2012/0146148 A1* | 6/2012 | Iwamatsu | H01L 27/1207 257/351 |
| 2012/0286375 A1* | 11/2012 | Cai | H01L 21/823412 257/412 |
| 2013/0095644 A1* | 4/2013 | Tu | H01L 29/66545 438/585 |
| 2013/0105919 A1* | 5/2013 | Jiang | H01L 29/401 257/411 |
| 2013/0187236 A1* | 7/2013 | Xie | H01L 29/4966 257/369 |
| 2013/0234254 A1* | 9/2013 | Ng | H01L 21/823857 257/369 |
| 2014/0070327 A1* | 3/2014 | Niimi | H01L 27/092 257/369 |
| 2014/0183657 A1* | 7/2014 | Lim | H01L 29/66575 257/380 |
| 2015/0021672 A1* | 1/2015 | Chuang | H01L 21/28088 257/288 |
| 2015/0028454 A1* | 1/2015 | Cheng | H01L 29/785 257/616 |
| 2015/0076623 A1* | 3/2015 | Tzou | H01L 21/823864 257/407 |
| 2015/0087144 A1* | 3/2015 | Liu | H01L 21/02074 438/595 |
| 2015/0137207 A1* | 5/2015 | Chuang | H01L 29/49 257/316 |

\* cited by examiner

METHOD FOR CMP OF HIGH-K METAL GATE STRUCTURES

CROSS-REFERENCES TO RELATED APPLICATIONS

This application claims priority to Chinese patent application No. 2014101226180.5, filed on May 26, 2014, the content of which is incorporated herein by reference in its entirety.

BACKGROUND OF THE INVENTION

The present invention relates to semiconductor devices and the fabrication of semiconductor devices, and more particularly to semiconductor devices in 32 nm technology nodes and beyond.

In the field of semiconductor technology, aluminum or aluminum alloy is mainly used in high-k metal gate (HKMG) process technology nodes at 32 nm and below (e.g., 28 nm). The use of aluminum or aluminum alloy for metal gate electrodes has cost and performance advantages. The aluminum gate chemical mechanical polishing (CMP) process is a very important process for manufacturing high-k metal gate transistors with aluminum gates.

In order to increase the gap filling space, a CMP process of aluminum gate structures typically includes two CMP steps: a CMP process for N-type aluminum gate transistors and a CMP process for P-type aluminum gate transistors.

Since a conventional CMP process utilizes a polish slurry that has a polysilicon removal rate greater than the aluminum removal rate, the polysilicon gate tends to be over-polished. Furthermore, an over-polishing of the polysilicon gate may occur during the CMP process of the aluminum gate of the N-type transistors.

FIG. 1 is a simplified cross-sectional view illustrating process steps of forming a semiconductor structure. FIG. 1 includes a top part, a middle part, and a bottom part. As shown in FIG. 1, the top part shows as having three transistor regions 101A, 101B, and 101C that are separated by an interlayer dielectric layer 101D after a CMP process has been performed on the interlayer dielectric layer. Transistor region 101A is denoted a P-type aluminum gate transistor region; transistor region 101B is denoted an N-type aluminum gate transistor region; and transistor region 101C is denoted a polysilicon gate transistor region. The middle part shows that there is a height loss 121 in the N-type aluminum gate transistor region and in the polysilicon gate transistor gate region after a CMP process has been performed on the P-type aluminum gate transistor region. The bottom part shows that there is a further height loss 122 after a chemical mechanical polishing process has been performed on the N-type aluminum gate region. As can be clearly seen, the height of the polysilicon gate transistor region is significantly reduced due to over-polishing, which seriously affects the performance and yield of the manufactured semiconductor device.

Thus, the conventional CMP process of planarizing the metal gate (e.g., aluminum) uses a slurry that has a higher metal removal rate than that of the polysilicon, resulting in an over-polishing of the polysilicon gate and impacting the performance and yield of the semiconductor device.

In view of the foregoing, there is a need for a novel method and apparatus for manufacturing a semiconductor device that can overcome the deficiencies of the prior art.

BRIEF SUMMARY OF THE INVENTION

Embodiments of the present invention provide a method for manufacturing a semiconductor device structure and a semiconductor device that can prevent the polysilicon gate from being over-polished while performing a CMP process on the metal gate.

In accordance with the present invention, a method for manufacturing a semiconductor device containing a front-end device with a metal gate in a metal gate transistor region and a polysilicon gate in a polysilicon gate region allows the chemical mechanical polishing of the metal gate without damaging the polysilicon gate. The method includes removing a thickness of the dummy gate in a metal gate transistor region and a polysilicon gate in a polysilicon gate transistor region and forming a protective layer on the polysilicon layer to protect the polysilicon layer during a CMP process, thereby improving the performance and yield of the semiconductor device.

In an embodiment, a method for manufacturing a semiconductor device includes providing a semiconductor substrate containing a front-end device, the front-end device comprising a first dummy gate in a first type metal gate transistor region, a second dummy gate in a second type metal gate transistor region, and a polysilicon gate in a polysilicon gate transistor region, forming an interlayer dielectric layer on the semiconductor substrate (S101), and removing a thickness of the first dummy gate, a thickness of the second dummy gate, and a thickness of the polysilicon gate so that the first dummy gate, the second dummy gate, and the polysilicon gate are below the interlayer dielectric layer (S102). The method also includes forming a protective layer on the first dummy gate, the second dummy gate, the polysilicon gate and the interlayer dielectric layer (S103), removing by etching a portion of the protective layer disposed on the first type metal gate transistor region and the first dummy gate (S104), forming a first work function metal layer in a location of the removed first dummy gate, forming a metal gate layer on the first work function metal layer (S105), and performing a chemical mechanical polishing (CMP) process to remove a portion of the metal gate layer and a portion of the first work function metal layer that are higher than the protective layer (S106). The CMP process comprises a slurry having a removal rate of the protective layer lower than a removal rate of the metal gate layer.

In one embodiment, removing the thickness of the first dummy gate, the thickness of the second dummy gate, and the thickness of the polysilicon gate includes a wet etching using an etchant including TMAH and a process time in a range between 60 seconds and 300 seconds, and preferably 180 seconds.

In one embodiment, the removed thickness of the first dummy gate, the second dummy gate and the polysilicon gate is in a range between 30 Angstroms and 60 Angstroms.

In one embodiment, the first dummy gate, the second dummy gate, and the polysilicon gate are formed in a same process and have a same height.

In one embodiment, forming the interlayer dielectric layer includes depositing on the semiconductor substrate a dielectric material, and performing a CMP process to remove a portion of the dielectric material higher than the first dummy gate, the second dummy gate, and the polysilicon gate.

In one embodiment, the protective layer may include titanium nitrite.

In one embodiment, forming the protective layer comprises a deposition process.

In one embodiment, the method further includes, before removing the portion of the protective layer disposed on the first type metal gate transistor region, forming a mask layer on the protective layer, the mask layer having an opening on the first type metal gate transistor region.

In one embodiment, the metal gate layer comprises aluminum or aluminum alloy.

In one embodiment, the CMP process comprises removing the protective layer. The CMP process stops when a surface of the polysilicon gate is exposed.

In one embodiment, the CMP process includes a slurry that has a removal rate of the first work function metal layer lower than a removal rate of the metal gate layer.

In one embodiment, the method further includes, after the CMP process, removing the second dummy gate in the second type metal gate transistor region; forming a second work function metal layer at a location of the removed second dummy gate; and forming a second metal gate layer on the second work function metal layer.

In one embodiment, the first type is a P-type and the second type is an N-type, or the first type is an N-type and the second type is a P-type.

In accordance with the present invention, an electronic device includes an electronic component and a semiconductor device electrically connected with the electronic component. The semiconductor device may include a front-end device that is fabricated using the above-described method.

In accordance with the present invention, by removing a thickness of the first dummy gate, a thickness of the second dummy gate and a thickness of the polysilicon gate so that the protective layer subsequently disposed on the first, second and polysilicon gates is below the metal gate layer, and by selecting a suitable slurry for the CMP process, an over-polishing of the polysilicon gate can be prevented, thereby improving the performance and yield of the semiconductor device. A suitable slurry may have a removal rate of the protective layer lower than a removal rate of the metal gate layer.

The following description, together with the accompanying drawings, will provide a better understanding of the nature and advantages of the claimed invention.

DETAILED DESCRIPTION OF THE INVENTION

Figure 1:
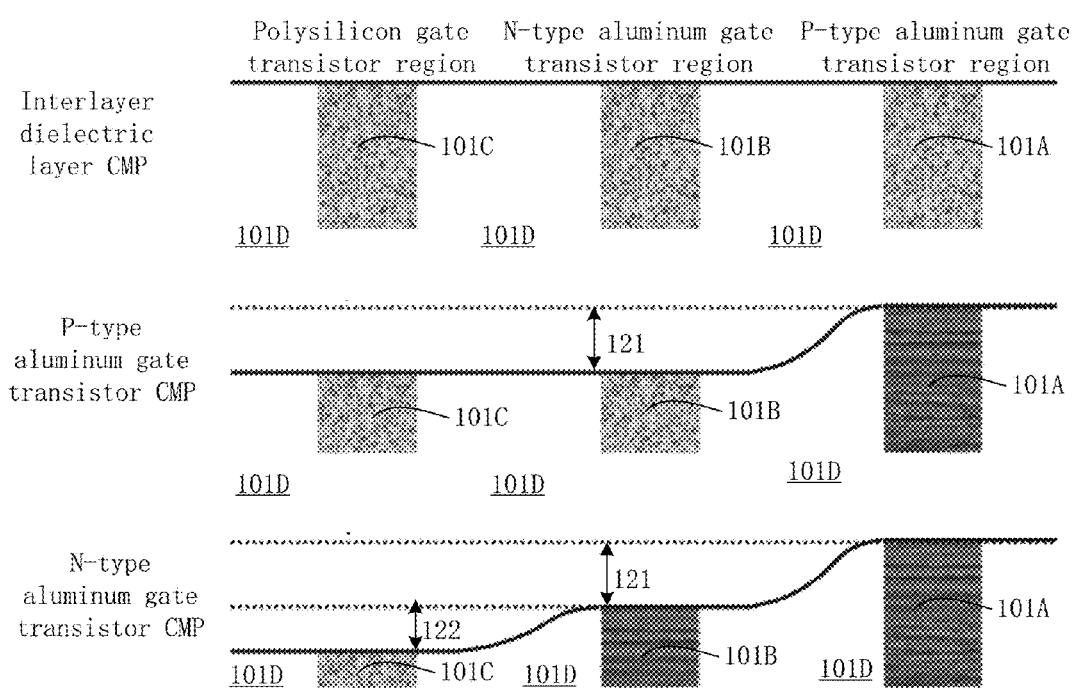
FIG. 1 is a simplified cross-sectional view illustrating process steps of forming a semiconductor structure in the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on" "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or sedion discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "substrate" and "wafer" may be used alternatively and may include silicon-on-insulator (SOI) or silicon-on-sapphire (SOS) technology, doped and undoped semiconductors, epitaxial layers of silicon supported by a base semiconductor foundation, and other semiconductor structures.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof Furthermore, as used herein, the words "and/or" may refer to and encompass any possible combinations of one or more of the associated listed items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Embodiment 1

Figure 2A:
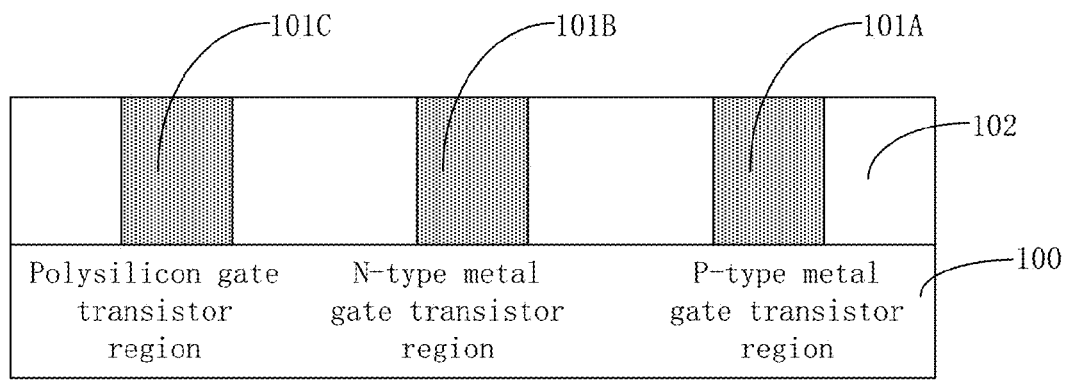
FIGS. 2A to 2F are cross-sectional views depicting stages of a method of manufacturing a semiconductor device according to an embodiment of the present invention.
Figure 2B:
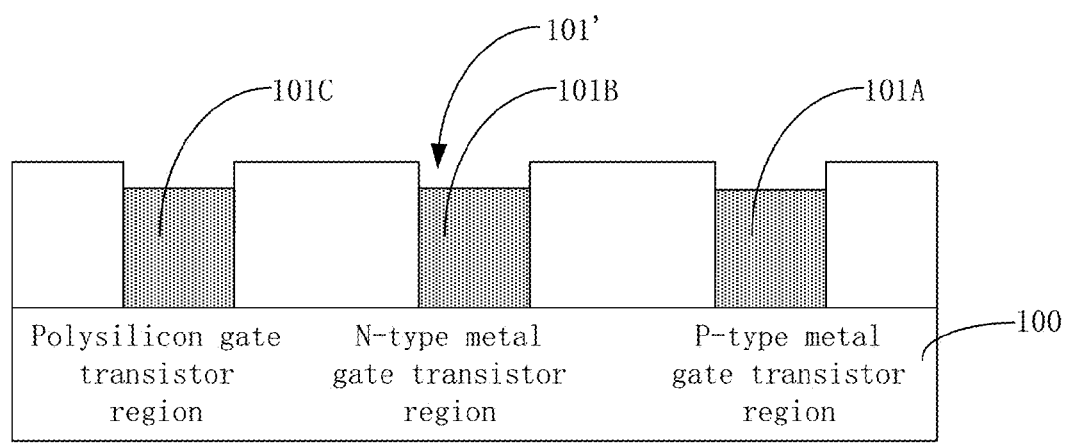
Figure 2C:
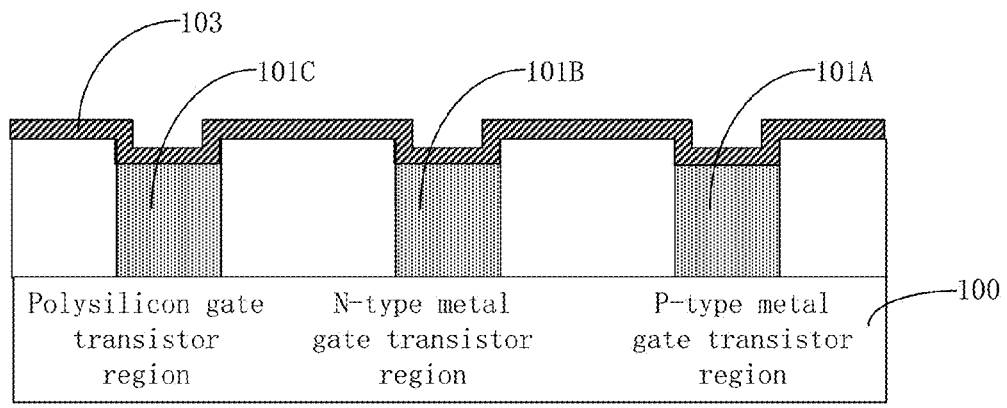
Figure 2D:
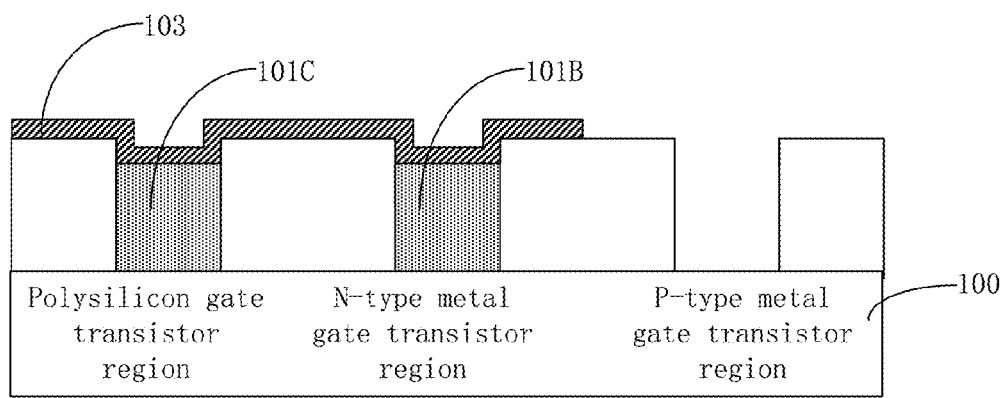
Figure 2E:
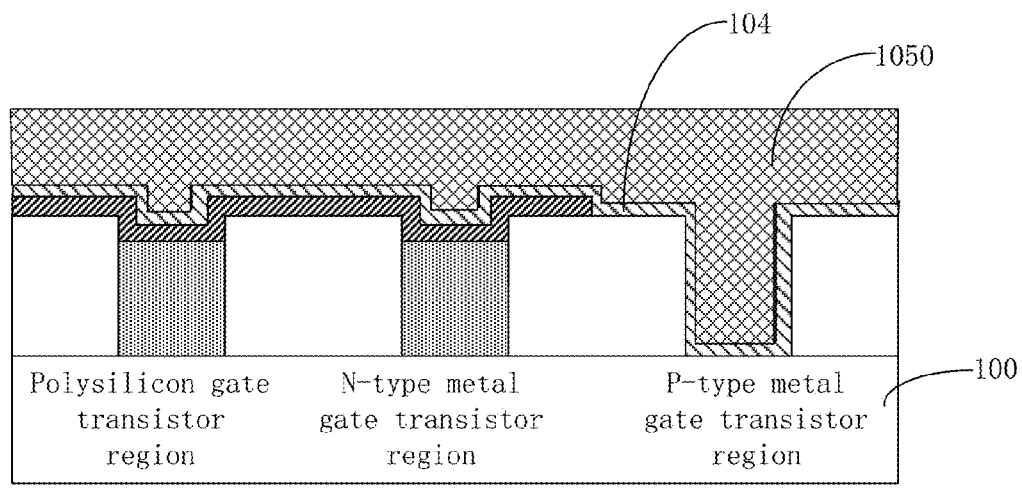
Figure 2F:
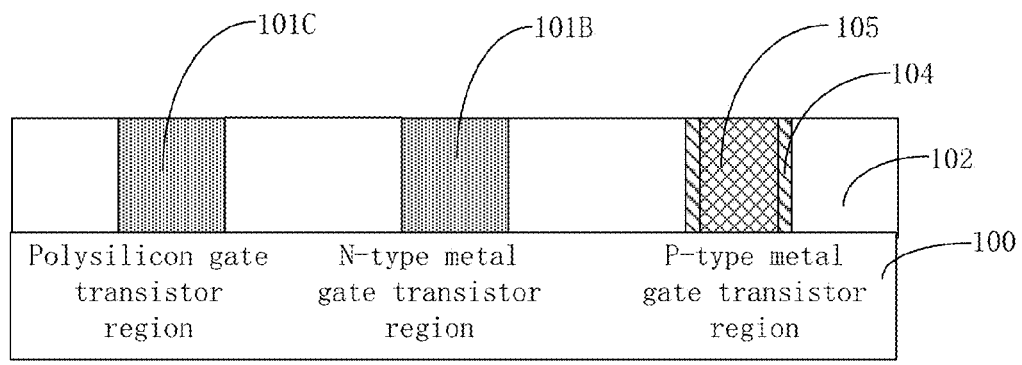
Figure 3:
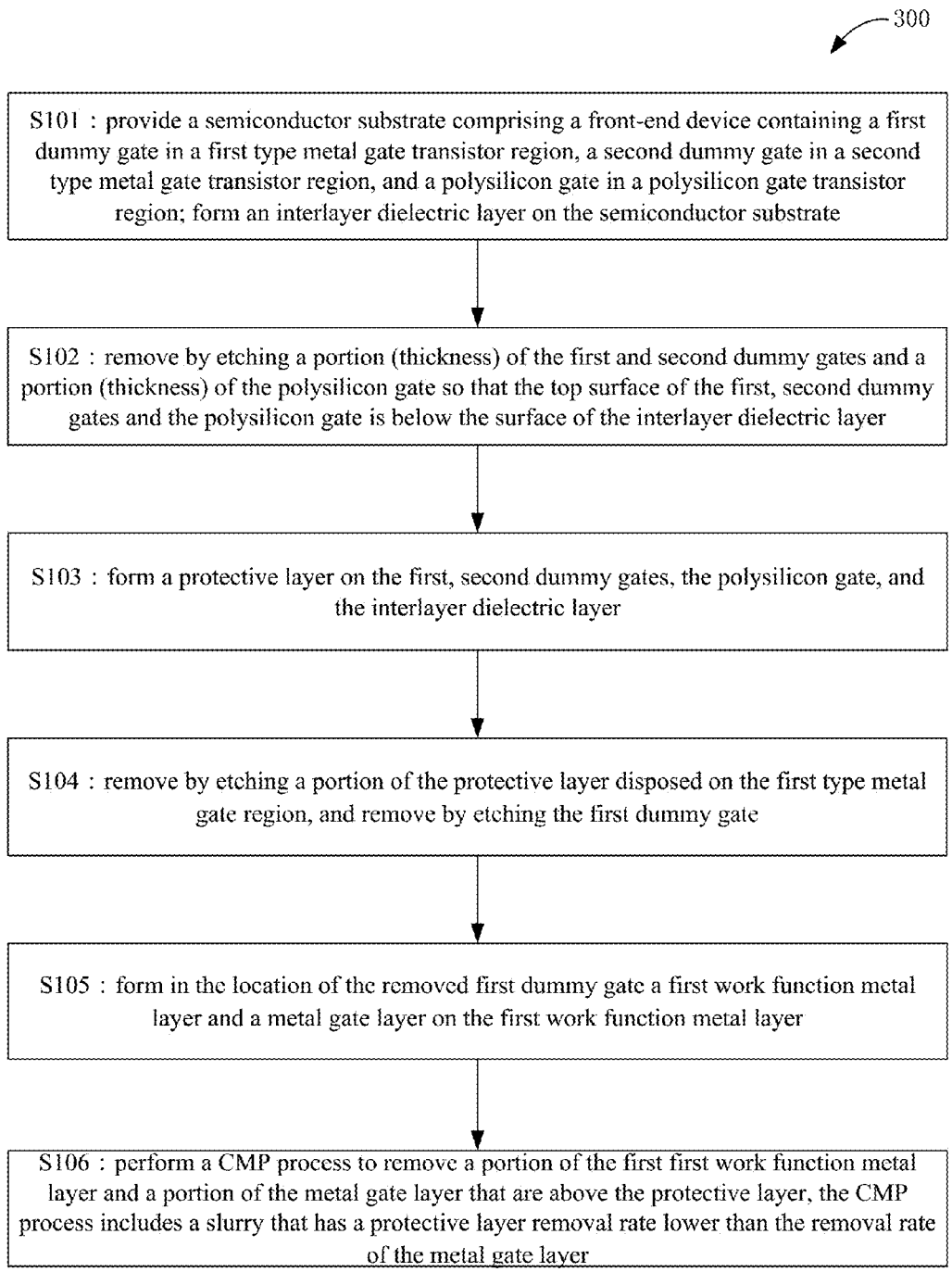
FIG. 3 is a simplified flow chart of a method of manufacturing a semiconductor device according to an embodiment of the present invention.

FIGS. 2A to 2F are cross-sectional views depicting stages of a method of manufacturing a semiconductor device according to an embodiment of the present invention, and FIG. 3 is a simplified flow chart of a method of manufacturing a semiconductor device according to an embodiment of the present invention. With reference to FIGS. 2A-2F and FIG. 3, a method according to the embodiment may include the following steps:

Step A1: provide a semiconductor substrate 100 comprising a front-end device, the front-end device comprising a first dummy gate 101A in a P-type metal gate transistor region, a second dummy gate 101B in an N-type metal gate transistor region, and a polysilicon gate 101C in a polysilicon gate region; and form an interlayer dielectric layer 102 on the semiconductor substrate, as shown in FIG. 2A.

In the embodiment, the front-end device is referred to as a structure that has been formed on the semiconductor substrate and may contain certain components, but the structure has not been completely processed to be a final semiconductor device. Of course, the front-end device is shown in FIG. 2A by way of example only, not by way of limitation. In other words, the front-end device may contain other components.

The P-type metal gate transistor region is referred to a region that is used to form one or more P-type metal gate transistors. The N-type metal gate transistor region is referred to a region that is used to form one or more N-type metal gate transistors. The polysilicon gate transistor region is referred to a region that is used to form one or more polysilicon gate transistors.

It is to be understood that polysilicon gate transistors are normal transistors to distinguish from high-k metal gate (HKMG) transistors. Polysilicon gate transistors can be N-type transistors or P-type transistors.

In the present disclosure, semiconductor substrate 100 may be a monocrystalline silicon substrate, SOI substrate, and other suitable substrate. First and second dummy gates 101A, 101B may be made of a same material as that of polysilicon gate 101C, i.e., a polysilicon material. In one exemplary embodiment, first and second dummy gates 101A, 101B may have the same height as polysilicon gate 101C, and can be formed together with polysilicon gate 101C using a same manufacturing process. It is understood that the number of first, second and polysilicon gates in the embodiment can be any number N. In the example shown in FIG. 2A, only one first dummy gate 101A, one second dummy gate 101B, and one polysilicon gate 101C are used for the respective P-type, N-type and polysilicon gate transistor region, i.e., N=1, but it is understood that the number (N=1) is arbitrary chosen for describing the example embodiment and should not be limiting.

In the embodiment, interlayer dielectric layer 102 is formed on semiconductor substrate 100 and filling the air gaps or voids disposed between first dummy gate 101A, second dummy gate 101B, and polysilicon gate 101C.

In an embodiment, forming interlayer dielectric layer 102 may include depositing a dielectric material on semiconductor substrate 100, and removing the excess dielectric material that is higher than the top surface of first dummy gate 101A, second dummy gate 101B, and polysilicon gate 101C using a CMP process, so that the top surface of the dielectric layer is flush (coplanar) with the surface of the first dummy gate 101A, second dummy gate 101B, and polysilicon gate 101C.

Step A2: remove by etching a portion of first dummy gate 101A, a portion of second dummy gate 101B, and a portion of polysilicon gate 101C, as shown in FIG. 2B.

In an embodiment, the thickness of the removed portion of first dummy gate 101A, the thickness of the removed portion of second dummy gate 101B, and the thickness of the removed portion of polysilicon gate 101C are in the range between 30 Angstroms and 50 Angstroms. Through the etching process, a groove or recess 101' is formed on the surface of first dummy gate 101A, second dummy gate 101B, and polysilicon gate 101C, i.e., through this etching step, the surface of first dummy gate 101A, second dummy gate 101B, and polysilicon gate 101C is below the surface of interlayer dielectric layer 102, as shown in FIG. 2B.

A wet etching can be used. In an embodiment, the wet etching may use an etchant of TMAH (tetramethyl ammonium hydroxide). Using TMAH as an etchant can ensure that other regions (e.g., the interlayer dielectric layer) are not unduly etched during etching of first dummy gate 101A, second dummy gate 101B, and polysilicon gate 101C. The time duration when using TMAH as an etchant can be between 60 seconds and 300 seconds, more preferably 180 seconds.

Conventional techniques do not include step A2. In accordance with the present invention, the etching step A2 is added to remove a certain portion (thickness) of first dummy gate 101A, second dummy gate 101B, and polysilicon gate 101C. in order to ensure that a subsequently formed protective layer 103 on polysilicon gate 101C is below a subsequently formed metal gate layer. By making the protective layer 103 on polysilicon gate 101C lower than the subsequently formed metal gate layer, an over-polishing of the polysilicon gate 101C can be prevented in a subsequent CMP process of the metal gate layer.

Experiments showed that the removed thickness of first dummy gate 101A, second dummy gate 101B, and polysilicon gate 101C was significantly less than the removed thickness of the polysilicon gate due to over-polishing in the prior art.

In addition, in this step, taking into consideration the removed thickness of first dummy gate 101A, second dummy gate 101B, and polysilicon gate 101C to ensure a final gate height, the height of first dummy gate 101A, second dummy gate 101B, and polysilicon gate 101C can be formed to be higher than a certain height (for example, the additional height can be equal to the then to be removed thickness).

Step A3: form a protective layer 103 on first dummy gate 101A, second dummy gate 101B, and polysilicon gate 101C, as shown in FIG. 2C.

Protective layer 103 can be titanium nitride (TiN) or other suitable materials. In a subsequent CMP process on the metal gate (aluminum gate), the used slurry has a removal rate of the protective layer lower than the removal rate of the metal gate.

Protective layer 103 can be formed by a deposition process or other suitable processes.

Step A4: remove a portion of the protective layer 103 located on the P-type metal gate transistor region by etching, and remove first dummy gate 101A, as shown in FIG. 2D. Thereafter, remove the first dummy gate 101A in the P-type metal transistor region, as shown in FIG. 2D.

In an embodiment, prior to removing the portion of protective layer 103, the method may form a mask layer having an opening disposed over the P-type metal gate transistor region. That is, the mask layer (not shown) covers the N-type metal gate transistor region, the polysilicon gate transistor region and exposes the P-type aluminum gate transistor region.

In this step, the etching process may be dry etching or wet etching. The removal of the portion of the protective layer 103 disposed on the P-type metal and the removal of the first dummy gate 101A can be performed concurrently by a same etching process or by different etching processes.

Step A5: form a first work function metal layer 104 in the location of the first dummy gate 101A that has been removed, and form a metal gate layer 1050 on the first work function metal layer 104, as shown in FIG. 2E.

The first work function metal layer 104 may be aluminum or other suitable materials. The metal gate layer 1050 may be aluminum, aluminum alloy or other suitable materials.

The first work function metal layer 104 may be formed by a deposition process or other suitable processes. The metal gate layer 1050 may be formed by a deposition process or other suitable processes.

Step A6: remove a portion of metal gate layer 1050 and a portion of first work function metal layer 104 that are above the top surface of the interlayer dielectric layer by a CMP process to form a first metal gate 105, as shown in FIG. 2F.

In an embodiment, the CMP process can be controlled in such a way that the CMP process will stop when the top surface of the polysilicon gate 101C is exposed in order to avoid excessive polishing of the polysilicon gate 101C.

In this step, protective layer 103 may not be removed. The retained protective layer 103 may be used in a subsequent removal of second dummy gate 101B to protect the polysilicon gate 101C.

In this step, the slurry used in the CMP process has a remove rate of the protective layer 103 (e.g., TiN) relatively lower than the remove rate of metal gate layer 1050, at the same time, since the protective layer 103 disposed on the polysilicon gate 101C is lower than the metal gate layer 1050, the portion of protective layer 103 disposed on the polysilicon gate 101C can protect polysilicon gate 101C during the CMP process to prevent the polysilicon gate 101C from being excessively removed, which solves the problems of excessive removal of the polysilicon gate of the prior art.

In addition, for the same reason, the portion of protective layer 103 disposed on second dummy gate 101B can be used to protect second dummy gate 101B during the CMP process to ensure that the metal gate corresponding to second dummy gate 101B has a relative high height.

Alternatively, the slurry may have a removal rate of the first work function metal layer lower than that of the metal gate layer, which may further ensure that the height of polysilicon gate 101C.

After step A6, the method may include the following steps with reference to steps A2 to A6: remove second dummy gate 101B in the N-type metal gate transistor region, and form a second work function metal layer in the location of the removed dummy gate 101B and a second metal gate layer on the second work function metal layer.

In the embodiment of the present invention, a metal gate can be first formed in the N-type metal gate transistor regions, followed by forming a metal gate in the P-type metal gate transistor region.

In an embodiment, the P-type metal gate transistors may be referred to as first type metal gate transistors, the N-type metal gate transistors may be referred to as second type metal gate transistors. Alternatively, the N-type metal gate transistors may be referred to as first type metal gate transistors, and the P-type metal gate transistors may be referred to as second type metal gate transistors.

In accordance with the embodiment, the method of manufacturing a semiconductor device includes removing by etching a portion (thickness) first dummy gate 101A, a portion of second dummy gate 101B and a portion of polysilicon gate 101C so that the portion of protective layer 103 disposed on polysilicon gate 101C is lower than the metal gate layer 1050, and by selecting a suitable material for the protective layer in such a way that a slurry has a removal rate of the protective layer 103 lower than the removal rate of the metal gate layer 1050. Thus, while the CMP process is performed on the metal gate layer, the protective layer may protect against excessive removal of the polysilicon gate 101C to ensure the height of the polysilicon gate 101C. Accordingly, the performance and yield of the semiconductor device can be improved.

Embodiment 2

FIG. 3 is a simplified flow chart of a method 300 for manufacturing a semiconductor device according to an embodiment of the present invention. Method 300 may include:

S101: provide a semiconductor substrate comprising a front-end device, the front-end device comprising a first dummy gate in a first type metal gate transistor region, a second dummy gate in a second type metal gate transistor region, and a polysilicon gate in a polysilicon gate transistor region; form an interlayer dielectric layer on the semiconductor substrate;

S102: remove by etching a thickness of the first dummy gate, a thickness of the second dummy gate, and a thickness of the polysilicon gate so that the first dummy gate, the second dummy gate, and the polysilicon gate are below the surface of the interlayer dielectric layer;

S103: form a protective layer on the first dummy gate, the second dummy gate, and the polysilicon gate;

S104: remove by etching a portion of the protective layer disposed on the first type metal gate transistor region, and remove by etching the first dummy gate;

S105: form a first work function metal layer in the location where the first dummy gate has been removed, and form a metal gate layer on the first work function metal layer;

S106: perform a CMP process to remove the portion of the metal gate layer and the portion of the first work function metal layer that are higher than the surface of the protective layer, the CMP process includes a slurry that has a removal rate of the protective layer lower than the removal rate of the metal gate layer.

In an embodiment, an electronic device may include a semiconductor device manufactured using the above-described method. The electronic device may be a laptop, a netbook, a game console, a TV, a DVD player, a GPS device, a camera, a voice recorder, MP3, MP4, PSP, a mobile phone, and other semiconductor devices including intermediate products and electronic components that are manufactured using the above-described method to improve performance.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although three gate transistor regions (P-type, N-type, polysilicon gate transistor regions) are used, it is understood that the number of the transistor regions can be more or fewer than three in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
   providing a semiconductor substrate containing a front-end device, the front-end device comprising a first dummy gate in a first type metal gate transistor region, a second dummy gate in a second type metal gate transistor region, and a polysilicon gate in a polysilicon gate transistor region, wherein the first dummy gate, the second dummy gate, and the polysilicon gate are formed in a same process and have a same height;
   forming an interlayer dielectric layer on the semiconductor substrate;
   removing a portion of the first dummy gate, a portion of the second dummy gate, and a portion of the polysilicon gate so that an upper surface of remaining portions of the first dummy gate, the second dummy gate, and the polysilicon gate is below an upper surface of the interlayer dielectric layer;
   forming a protective layer on the remaining portions of the first dummy gate, the second dummy gate, the polysilicon gate and the interlayer dielectric layer;
   removing by etching a portion of the protective layer disposed on the first type metal gate transistor region and removing the remaining portion of the first dummy gate;
   forming a first work function metal layer in a location of the removed first dummy gate and over a remaining portion of the protective layer disposed on the second dummy gate and the polysilicon gate;
   forming a metal gate layer on the first work function metal layer;
   performing a chemical mechanical polishing (CMP) process to remove a portion of the metal gate layer and a portion of the first work function metal layer that are higher than the protective layer, wherein the CMP process comprises a slurry having a removal rate of the protective layer lower than a removal rate of the metal gate layer.

2. The method of claim 1, wherein removing the portion of the first dummy gate, the portion of the second dummy gate, and the portion of the polysilicon gate comprises a wet etching using an etchant including TMAH and a process time in a range between 60 seconds and 300 seconds.

3. The method of claim 2, wherein the process time is 180 seconds.

4. The method of claim 1, wherein the removed portion of the first dummy gate, the second dummy gate and the polysilicon gate is in a range between 30 Angstroms and 60 Angstroms.

5. The method of claim 1, wherein forming the interlayer dielectric layer comprises:
   depositing on the semiconductor substrate a dielectric material;
   performing a CMP process to remove a portion of the dielectric material higher than the first dummy gate, the second dummy gate, and the polysilicon gate.

6. The method of claim 1, wherein the protective layer comprises titanium nitrite.

7. The method of claim 1, wherein forming the protective layer comprises a deposition process.

8. The method of claim 1, further comprising, before removing the portion of the protective layer disposed on the first type metal gate transistor region:
   forming a mask layer on the protective layer, the mask layer having an opening on the first type metal gate transistor region.

9. The method of claim 1, wherein the metal gate layer comprises aluminum or aluminum alloy.

10. The method of claim 1, wherein the CMP process comprises removing the protective layer.

11. The method of claim 1, wherein the CMP process stops when a surface of the polysilicon gate is exposed.

12. The method of claim 1, wherein the CMP process comprises a slurry having a removal rate of the first work function metal layer lower than a removal rate of the metal gate layer.

13. The method of claim 1, wherein the first type is a P-type and the second type is an N-type, or the first type is an N-type and the second type is a P-type.

14. The method of claim 1, wherein the first work function metal layer comprises aluminum.

* * * * *